United States Patent
Yi et al.

(10) Patent No.: US 9,748,520 B2
(45) Date of Patent: Aug. 29, 2017

(54) ORGANIC LIGHT EMITTING DIODES DISPLAYS INCLUDING FLEXIBLE SUBSTRATE AND MANUFACTURING METHOD THEREOF

(71) Applicant: Samsung Display Co., Ltd., Yongin, Gyeonggi-Do (KR)

(72) Inventors: Chung Yi, Yongin (KR); Sang-Hun Oh, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/177,257

(22) Filed: Jun. 8, 2016

(65) Prior Publication Data

US 2016/0285055 A1   Sep. 29, 2016

Related U.S. Application Data

(62) Division of application No. 14/106,434, filed on Dec. 13, 2013, now Pat. No. 9,461,267.

(30) Foreign Application Priority Data

Jun. 3, 2013   (KR) .................. 10-2013-0063509

(51) Int. Cl.
   *H01L 51/05*   (2006.01)
   *B82Y 10/00*   (2011.01)
   (Continued)

(52) U.S. Cl.
   CPC ...... *H01L 51/5253* (2013.01); *H01L 51/0097* (2013.01); *H01L 51/5281* (2013.01); *H01L 51/5293* (2013.01); *H01L 51/56* (2013.01); *H01L 27/3244* (2013.01); *H01L 2227/323* (2013.01); *H01L 2251/5338* (2013.01); *H01L 2251/566* (2013.01)

(58) Field of Classification Search
   CPC ............ H01L 51/0545; H01L 51/0036; H01L 51/0541; H01L 51/5012; H01L 27/1214; H01L 51/56; B82Y 10/00; B82Y 30/00; Y02E 10/50
   USPC ....................................... 257/40; 438/82, 99
   See application file for complete search history.

(56) References Cited

U.S. PATENT DOCUMENTS 9,461,267 B2   10/2016   Yi et al.
2003/0164497 A1   9/2003   Carcia et al.
(Continued)

FOREIGN PATENT DOCUMENTS

JP   2004-325888   11/2004
JP   2009-122386   6/2009
(Continued)

*Primary Examiner* — John C Ingham
*Assistant Examiner* — Didarul Mazumder
(74) *Attorney, Agent, or Firm* — Innovation Counsel LLP

(57) ABSTRACT

A cracks propagation preventing, polarization film attaches to outer edges of a lower inorganic layer of an organic light emitting diodes display where the display is formed on a flexible substrate having the lower inorganic layer blanket formed thereon. The organic light emitting diodes display further includes a display unit positioned on the inorganic layer and including a plurality of organic light emitting diodes configured to display an image, and a thin film encapsulating layer covering the display unit and joining with edges of the inorganic layer extending beyond the display unit.

12 Claims, 10 Drawing Sheets

(51) Int. Cl.
*H01L 51/00* (2006.01)
*H01L 51/50* (2006.01)
*H01L 27/12* (2006.01)
*H01L 51/56* (2006.01)
*B82Y 30/00* (2011.01)
*H01L 51/52* (2006.01)
*H01L 27/32* (2006.01)

(56) References Cited

U.S. PATENT DOCUMENTS

| | | |
|---|---|---|
| 2007/0194318 A1 | 8/2007 | Jung et al. |
| 2010/0308335 A1 | 12/2010 | Kim et al. |
| 2011/0114993 A1 | 5/2011 | Lee et al. |
| 2012/0007107 A1 | 1/2012 | Choi |
| 2012/0139821 A1 | 6/2012 | Kim et al. |
| 2012/0161618 A1* | 6/2012 | Kwon ................ H01L 27/3276 313/506 |
| 2012/0235207 A1 | 9/2012 | Kwack et al. |
| 2012/0242222 A1 | 9/2012 | Jung et al. |
| 2012/0267660 A1* | 10/2012 | Han ..................... H01L 51/524 257/98 |
| 2013/0328025 A1 | 12/2013 | Ono |

FOREIGN PATENT DOCUMENTS

| | | |
|---|---|---|
| KR | 10-0137989 B1 | 6/1998 |
| KR | 10-2008-0048669 A | 6/2008 |
| KR | 10-2011-0022381 A | 3/2011 |
| KR | 10-2012-0082736 A | 7/2012 |
| KR | 10-2012-0119768 A | 10/2012 |

\* cited by examiner

ORGANIC LIGHT EMITTING DIODES DISPLAYS INCLUDING FLEXIBLE SUBSTRATE AND MANUFACTURING METHOD THEREOF

RELATED APPLICATIONS

This application is a divisional of U.S. patent application Ser. No. 14/106,434, filed on Dec. 13, 2013, which claims priority to and the benefit of Korean Patent Application No. 10-2013-0063509 filed in the Korean Intellectual Property Office on Jun. 3, 2013, as authorized under 35 USC §119. The entire contents of these previously filed applications are incorporated herein by reference.

BACKGROUND

1. Field of Disclosure

The here described technology relates generally to an organic light emitting diodes display (OLEDD), and more particularly, to an organic light emitting diodes display having a planarization film, and a manufacturing method thereof.

2. Description of Related Technology

In an organic light emitting diodes display, a pixel circuit and an organic light emitting diode (OLED) are disposed at every pixel area on a substrate, and light emitted from the plurality of organic light emitting diodes is combined to display an image. If the organic light emitting diodes display uses a polymer film as its substrate it may have a bending characteristic. In such a case it includes a flexible thin film encapsulating layer to encapsulate the organic light emitting diodes. The flexible thin film encapsulating layer is susceptible to cracking when exposed to external impacts.

During mass production fabrication, the pixel circuits, the organic light emitting diodes, and various wirings may be simultaneously formed while forming a plurality of display panels (referred to as unit cells) on a mother substrate, and then the monolithically integrated display panels are separated into individual unit cells by cutting the mother substrate. In this case, each unit cell is divided into a display area in which the pixel circuits and the organic light emitting diodes are positioned, and into a pad area in which pad electrodes are positioned.

Particularly, in one mass production method of manufacturing the organic light emitting diodes display, the process may include the steps of (1) forming the plurality of unit cells on the mother substrate, (2) forming the thin film encapsulating layer on the display area of each unit cell, (3) attaching a passivation film to an entire upper portion of the mother substrate, (4) separating the mother substrate into the individual unit cells by cutting the mother substrate, (5) removing a portion of the passivation film corresponding to the pad area; (6) performing an examination after removing the portion corresponding to the pad area in the passivation film, (7) removing the passivation film of the unit cells that are determined from the examination to be non-defective product and (8) attaching a polarization film to such non-defective product.

The aforementioned organic light emitting diodes display has a very complicated manufacturing process, and thus is difficult to mass produce with consistency and minimized defects. Further, in the process, a partial area of an inorganic layer (a barrier layer, a buffer layer, and the like) formed on the substrate may not be covered with the thin film encapsulating layer and the polarization film and thus it is exposed. When an external impact is applied to the exposed inorganic layer, cracks can easily occur, and the cracks are propagated into the display panel, thereby causing a contagious defect that can spread across the organic light emitting diodes displays of the mother substrate.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The described technology has been made in an effort to provide an organic light emitting diodes display capable of simplifying a manufacturing process and preventing a contagiously spread defect by suppressing an occurrence of cracks due to an exposure of an inorganic layer to crack inducing impacts.

A cracks propagation preventing, polarization film attaches to outer edges of a lower inorganic layer of an organic light emitting diodes display where the display is formed a on a flexible substrate having the lower inorganic layer blanket formed thereon. The organic light emitting diodes display further includes a display unit positioned on and within an interior area of the inorganic layer and including a plurality of organic light emitting diodes configured to display an image, and a thin film encapsulating layer covering the display unit and joining with exterior edges of the inorganic layer that extend beyond the display unit.

More specifically, an exemplary organic light emitting diodes display, includes a flexible substrate, an inorganic layer formed on an entire upper surface of the substrate, a display unit positioned on and in an interior portion of the inorganic layer and including a plurality of organic light emitting diodes to display an image, a thin film encapsulating layer fully covering the display unit and extending to attach to outer edges of the inorganic layer, and a polarization film attached to and fully covering the thin film encapsulating layer and extending to attach to yet further outer edges of the inorganic layer that are at an exterior side of the thin film encapsulating layer.

A pads area may be positioned at an exterior side of the display unit on the substrate, and the polarization film may be attached on the entire remaining areas over the substrate, except for the pads area which is exposed to allow for electrical testing. The polarization film may include one edge, which is in contact with the pads area, and three edges, which are matched with edges of the substrate. The substrate may be formed of a polymer film, and the inorganic layer may include at least one of a barrier layer and a buffer layer.

The disclosure provides a method of manufacturing an organic light emitting diodes display, including forming an inorganic layer to fully cover a flexible mother substrate, forming a plurality of spaced apart display units on the inorganic layer so as to form a matrix of unit cells, forming spaced apart thin film encapsulating layers at upper portions of the corresponding matrix of display units, respectively, attaching a polarization film exposed portions of the inorganic layer so as to also thereby fully cover the plurality of thin film encapsulating layers (while leaving exposed the pads areas so as to allow for electrical testing of the plural pads areas); and separating the plurality of unit cells into individual unit cells by cutting the mother substrate and the polarization film.

The flexible mother substrate may be formed of a polymer film, and each of the plurality of unit cells may include a pads area at an exterior side of the display unit. The plurality of unit cells may be disposed as rows extending in two directions crossing each other, and each of the plurality of display units and the plurality of pad areas may be disposed in a row in one direction between the two directions.

The polarization films having the same number as that of the mother substrates may be provided, and may be provided with openings through which the plurality of pads areas is exposed. The polarization films may be provided with slit-shaped openings parallel to the one direction to simultaneously expose the plurality of pad areas positioned in the one direction. One row of pad areas among the plurality of pad areas may be positioned at an exterior side of one side edge of the polarization film.

In the meantime, the polarization films may be formed in rod shapes parallel to the one direction to cover one row of thin film encapsulating layers positioned in parallel to the one direction among the plurality of thin film encapsulating layers. The one side edge of the polarization film may be in contact with a boundary of the pad area toward the display unit, and an opposite side edge may be positioned at an exterior side of the edge of the thin film encapsulating layer.

The polarization film in the individual unit cells may be positioned on the thin film encapsulating layer and in contact with the outer edges of the inorganic layer that extend beyond the exterior sides of the thin film encapsulating layer.

DETAILED DESCRIPTION

The present disclosure of invention will be described more fully hereinafter with reference to the accompanying drawings, in which exemplary embodiments are shown. As those skilled in the art would realize in light of this disclosure, the described embodiments may be modified in various different ways, all without departing from the spirit or scope of the present teachings.

Unless explicitly described to the contrary, the word "comprise" and variations such as "comprises" or "comprising", will be understood to imply the inclusion of stated elements but not the exclusion of any other elements. Further, it will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

Figure 1:
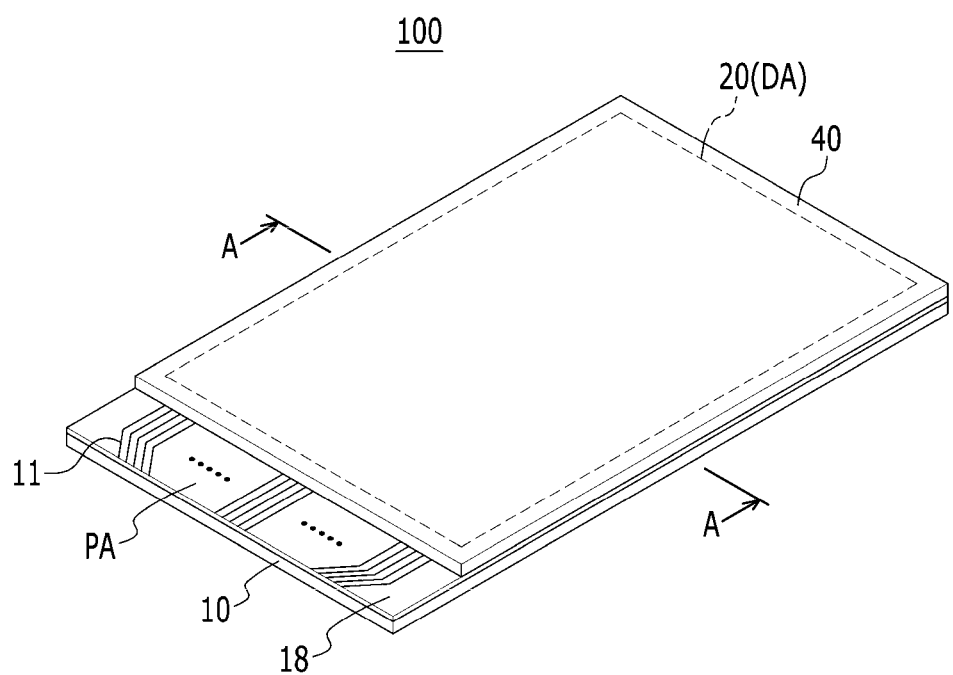
FIG. 1 is a perspective view of an organic light emitting diodes display according to an exemplary embodiment.
Figure 2:
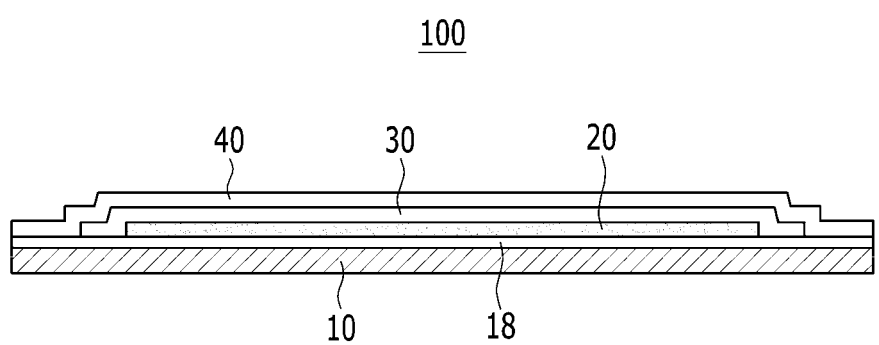
FIG. 2 is a cross-sectional view of the organic light emitting diodes display taken along line A-A of FIG. 1.

FIG. 1 is a perspective view of an organic light emitting diodes display according to an exemplary embodiment. FIG. 2 is a cross-sectional view of the organic light emitting diodes display taken along line A-A of FIG. 1.

Referring to FIGS. 1 and 2, an organic light emitting diodes display 100 includes a substrate 10, and a display unit 20, a thin film encapsulating layer 30, and a polarization film 40 which are formed on the substrate 10 substantially in the recited order.

The substrate 10, which is a flexible film, may be formed of a transparent or opaque polymer film (for example, polyimide). The substrate 10 is subdivided into a display area DA and a pads area PA. The pads area PA is in contact with an edge of one side of the substrate 10, and with wirings extending into the display area DA. The pads area PA is positioned so as to leave a predetermined distance from the edge of the substrate 10 to the remaining areas of the substrate 10, except for the pad area PA.

The display unit 20 includes a plurality of organic light emitting diodes and a plurality of pixel circuits that are positioned in the display area DA. At least one organic light emitting diode (OLED) and a corresponding pixel circuit are provided for each pixel. The display unit 20 displays an image by combining lights emitted from the plurality of organic light emitting diodes.

Pad electrodes 11 are connected by way of integrally extending conductors to the respective pixel circuits of the display unit 20. The pad electrodes 11 are positioned in the pads area PA. In one embodiment, the pad electrodes 11 are not only connected to the circuitry under the encapsulating layer 30 but also to external further circuitry such as a chip on film control circuit and/or an external printed circuit board, which are not illustrated. In other words, the pad electrodes 11 receive control and/or data signals from the external further circuitry for use in driving the pixels of the display area 20 (DA). Alternatively or additionally, one or more on-board integrated circuit chips (not illustrated) may be positioned in the pads area PA for serving as scan line drivers and/or data line drivers that respectively drive plural scan lines and plural data lines provided under the encapsulating layer 30.

It is to be observed that in the cross sectional view of FIG. 2, the thin film encapsulating layer 30 joins directly at its ends with an underlying inorganic layer 18 so as to thereby fully and protectively encapsulate the display unit 20.

Figure 3:
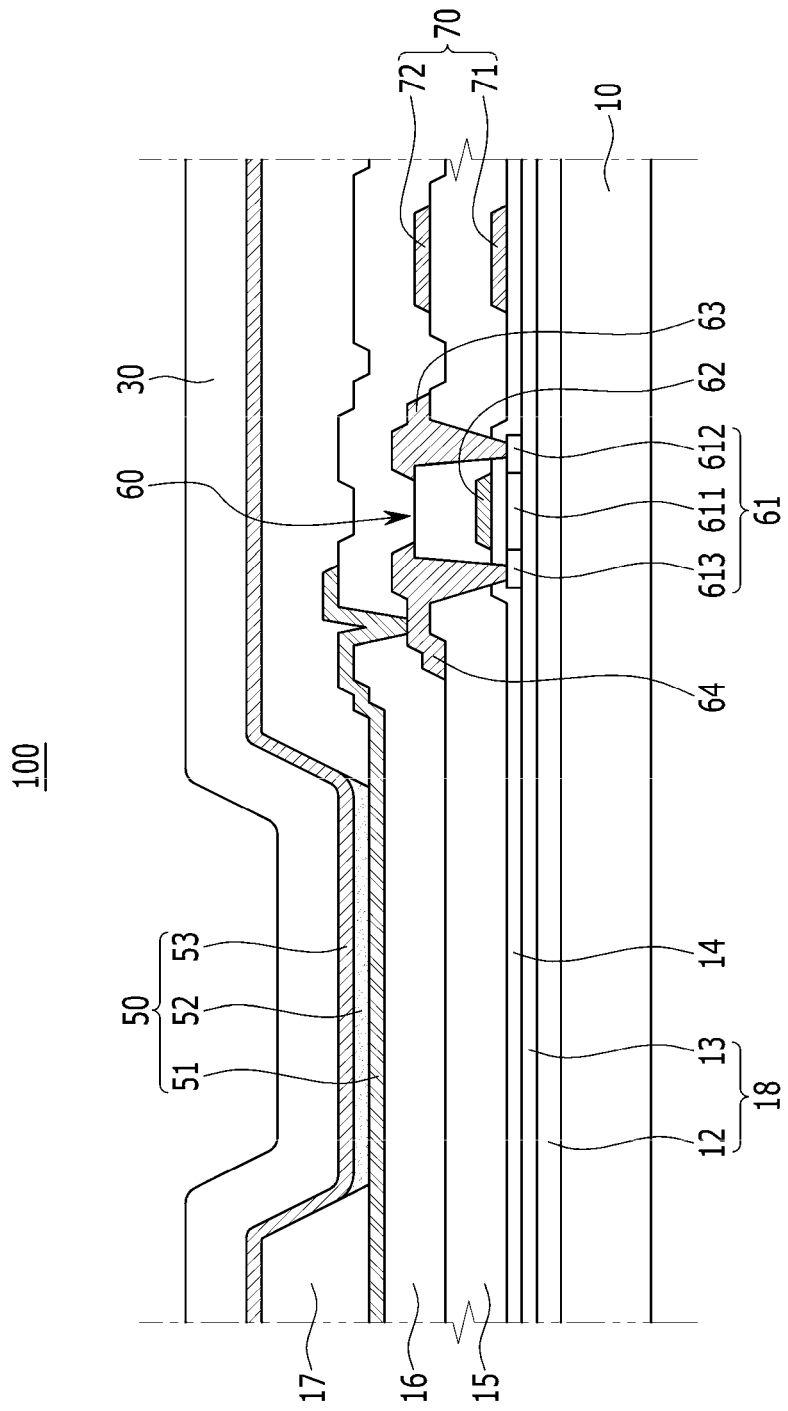
FIG. 3 is an enlarged cross-sectional view of a display unit and a thin film encapsulating layer illustrated in FIG. 2.

FIG. 3 is an enlarged cross-sectional view of the display unit 20, the thin film encapsulating layer 30 and the inorganic layer 18 where the inorganic layer is comprised of sublayers 12 and 13 (also referred to herein as layers 12 and 13).

Referring to FIG. 3, sublayer 12 serves as a barrier layer 12 and sublayer 13 serves as a buffer layer 13. These thin film sublayers, 12 and 13 are deposited on the entire upper surface of the flexible substrate 10 and are configured to flex with the flexible substrate 10. The barrier layer 12 includes a plurality of different and relatively thin inorganic layers, and may be formed in a structure in which, for example, an $SiO_2$ layer and an SiNx layer are alternately and repeatedly stacked so as to provide flexibility and impermeability to oxygen and/or other corrosive materials (e.g., H2O). The barrier layer 12 has a substantially smaller moisture transmission rate and a substantially smaller oxygen transmission rate than those of the polymer substrate 10. Thus the barrier layer 12 inhibits or prevents moisture and oxygen that permeates through the flexible polymer substrate 10 from further permeating inwardly so as to damage the pixel circuits and their corresponding organic light emitting diodes 50.

The buffer layer 13 is also formed of an inorganic layer, and may include, for example, a planarized $SiO_2$ or SiNx layer. The buffer layer 13 provides a flat dielectric surface for forming thereon the pixel circuit, and it also suppresses moisture and foreign substances from permeating inwardly to attack the pixel circuits and their corresponding organic light emitting diodes 50.

One or more thin film transistors such as the exemplary TFT 60 and one or more capacitors such as the exemplary Cst 70 are provided as encapsulated between the thin film encapsulating layer 30 and the inorganic layer 18 (comprised of sublayers 12 and 13) for forming a corresponding pixel circuit. The thin film transistor 60 includes a semiconductive layer 61, a gate electrode 62, and source/drain electrodes 63 and 64. The semiconductive layer 61 may be formed of one of a polysilicon or of a semiconductive oxide, and it includes a channel area 611 in which an impurity is not heavily doped, and source/drain areas 612 and 613 in which one or more conductivity providing impurities are doped at both sides of the channel area 611. When the semiconductive layer 61 is formed of the semiconductive oxide, a separate passivation layer (not shown) for protecting the semiconductive layer 61 may be added.

A gate insulating layer 14 is positioned between the semiconductive layer 61 and the gate electrode 62, and an interlayer insulating layer 15 is positioned between the gate electrode 62 and the source/drain electrodes 63 and 64. The gate insulating layer 14 and the interlayer insulating layer 15 may be formed of an organic material or an inorganic material, such as $SiO_2$ and SiNx.

The capacitor 70 includes a first plate capacitor 71 formed on the gate insulating layer 14, and a second plate capacitor 72 formed on the interlayer insulating layer 15. The first plate capacitor 71 may be formed of the same material as that of the gate electrode 62, and the second plate capacitor 72 may be formed of the same material as those of the source/drain electrodes 63 and 64. The second plate capacitor 72 may be connected with the source electrode 63.

The thin film transistor 60 illustrated in FIG. 3 functions as an OLED driving film transistor. Although not shown, the pixel circuit may further include a switching thin film transistor for selectively coupling a signal on an adjacent data line to the OLED driving transistor 60. In other words, the switching thin film transistor is used as a switching element for selecting a pixel that is desired to be made to emit a certain predetermined magnitude of light, and the driving thin film transistor applies power for making the OLED 50 of the selected pixel emit that predetermined magnitude of light.

A planarizing layer 16 is positioned on the source/drain electrodes 63 and 64 and the second plate capacitor 72. The planarizing layer 16 is formed of an organic material or an inorganic material, or a complex form of an organic material and an inorganic material. An acryl-based resin, an epoxy resin, a phenol resin, a polyamide-based resin and the like may be used as the organic material. The planarizing layer 16 is provided with a via hole through which a part of the drain electrode 64 communicates to connect with the organic light emitting diode 50 that is formed on the planarizing layer 16.

The organic light emitting diode (OLED) 50 includes a pixel electrode 51, an organic emission layer 52, and a common electrode 53. The pixel electrode 51 is individually formed at each pixel, and is connected with the drain electrode 64 of the thin film transistor 60 through the via hole. The common electrode 53 is formed of a light-passing material (e.g., ITO) and extends over the entire display area DA. A pixel bordering/defining layer 17 is positioned on the pixel electrode 51. The pixel defining layer 17 is provided with an opening through which the pixel electrode 51 is exposed, and the organic emission layer 52 is formed at the opening to be in contact with the pixel electrode 51. The pixel defining layer 17 may be formed of an opaque material.

The organic emission layer 52 may be any one of a red emission layer, a green emission layer, and a blue emission layer. On the other hand, the organic emission layer 52 may be a white emission layer, or a stacked layer of the red emission layer, the green emission layer, and the blue emission layer. In a latter case, the organic light emitting diodes display 100 may further include one or more color filters (not illustrated). The color filters may include a red filter corresponding to a red pixel, a green filter corresponding to a green pixel, and a blue filter corresponding to a blue pixel.

One of the pixel electrode 51 and the common electrode 53 serves as an anode which is a hole injection electrode, and the other serves as a cathode which is an electron injection electrode. Holes injected from the anode and electrons injected from the cathode are combined in the organic emission layer 52 to generate photons and thus light emission is performed when paired combinations (excitons) of combining holes and electrons join and discharge their combined energy.

At least one of a hole injection layer and a hole transport layer may be positioned between the anode and the organic emission layer 52, and at least one of an electron injection layer and an electron transport layer may be positioned between the organic emission layer 52 and the cathode. The hole injection layer, the hole transport layer, the electron transport layer, and the electron injection layer may be formed on the entire display area DA without distinction as to which pixel they belong to.

The pixel electrode 51 may be a reflective electrode, while the common electrode 53 is a transflective (and thus resonance creating) or a transmissive electrode. The pixel electrode 51 may be a single layer or a multilayer containing at least one of aluminum (Al), gold (Au), silver (Ag), magnesium (Mg), lithium (Li), and calcium (Ca). The common electrode 53 may contain any one of an indium-tin oxide (ITO), an indium-zinc oxide (IZO), a zinc oxide (ZnO), and an indium oxide ($In_2O_3$).

Light emitted from the organic emission layer 52 is reflected from the pixel electrode 51, penetrates the common electrode 53, and then is discharged to the outside for perception by a user. In a case where the common electrode 53 is the transflective type, some of the light rays are reflected to the pixel electrode 51 from the common electrode 53 again to thereby form a resonant optics structure.

The thin film encapsulating layer 30 is positioned on the plurality of organic light emitting diodes 50. The thin film encapsulating layer 30 encapsulates the organic light emitting diodes 50 from an external environment containing moisture and oxygen to suppress deterioration in the organic light emitting diodes 50 due to exposure to moisture and/or oxygen. The thin film encapsulating layer 30 may be formed of a configuration in which a plurality of organic layers and a plurality of inorganic layers are alternately stacked one by one so as to provide flexibility.

The organic layer of the thin film encapsulating layer 30 is formed of polymer, and may be a single layer or a stacked layer formed of any one of, for example, polyethyleneterephthalate, polyimide, polycarbonate, epoxy, polyethylene, and polyacrylate. The inorganic layer of the thin film encapsulating layer 30 may be a single layer or a stacked layer containing a silicon oxide or a silicon nitride, a metal oxide or a metal nitride. For example, the inorganic layer may contain any one of SiNx, $Al_2O_3$, $SiO_2$, and $TiO_2$.

Referring to FIGS. 1 to 4, a polarization film 40 is attached on an exterior surface of the thin film encapsulating layer 30, and suppresses external light reflection which might be induced by nonplanar structures within the display area (DA), thereby improving visibility of the display unit 20.

To reiterate, the inorganic layer 18 (see FIGS. 1 and 2) on the substrate 10 is formed on the entire upper surface of the substrate 10 to have the same width as that of the substrate 10. In this case, the inorganic layer 17 includes at least one of the aforementioned battier layer 12 and buffer layer 13. The display unit 20 is disposed to be spaced apart from the edge of the substrate 10 toward an inner side of the substrate 10. The thin film encapsulating layer 30 is formed to have a larger area than that of the display unit 20 and to thus; in combination with the inorganic layer 18 (i.e. layers 12-13) encapsulate the display unit 20. The thin film encapsulating layer 30 is also disposed to be spaced apart from the edge of the substrate 10 toward the inner side of the substrate 10.

Additionally, the polarization film 40 is formed on the entire remaining areas of the substrate 10, except for the pad area PA. That is, the polarization film 40 is formed to have the same size as those of the remaining areas of the substrate 10, except for the pad area PA. In other words, three edges except for one edge of the four-edged polarization film 40 (where the one exception is the edge which is in contact with the pad area PA) are matched with the edges of the substrate 10 after the display cell unit is separated from its mother substrate. Accordingly, the inorganic layer 18 at an exterior side of the display unit 20 is covered with the polarization film 40 in the remaining areas of the substrate 10, except for the pad area PA, so that the inorganic layer 18 is not exposed to scratching or crack-inducing impacts from the outside.

The polarization film 40 covers and protects the inorganic layer 18 of the exterior side of the display unit 20, thereby blocking most of the external impact applied to the inorganic layer 18 in a process of manufacturing the organic light emitting diodes display 100 and a process of assembling the organic light emitting diodes display 100 with other components after the manufacturing.

Accordingly, the polarization film 40 suppresses an occurrence of cracks of the inorganic layer 18, and even though the cracks occur in the inorganic layer 18 due to the external impact applied from a side surface, the polarization film 40 may block the cracks from being further propagated with the display unit 20 or to further display units of a common mother substrate. As a result, a contractible defect of the organic light emitting diodes display 100 according to the propagation of the cracks to the display unit 20 may be prevented or its spread reduced.

Figure 4:
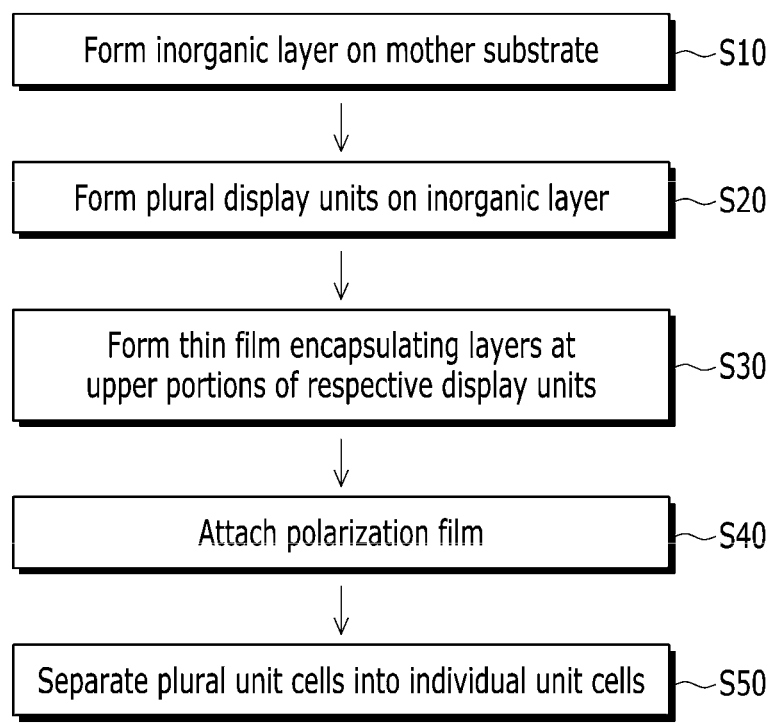
FIG. 4 is a process flowchart illustrating a method of manufacturing the organic light emitting diodes display according to an exemplary embodiment.

FIG. 4 is a process flowchart illustrating a method of manufacturing the organic light emitting diodes display according to the exemplary embodiment.

Referring to FIG. 4, the method of manufacturing the organic light emitting diodes display includes: (1) a first step S10 of forming an inorganic layer on and over the whole surface of a mother substrate, (2) a second step S20 of forming a plurality of display units on the inorganic layer so as to form a plurality of unit cells, and (3) a third step S30 of forming a thin film encapsulating layer at an upper portion of each of the plurality of display units. Further, the method of manufacturing the organic light emitting diodes displays on a mother substrate includes (4) a fourth step S40 of attaching a polarization film on the inorganic layer so as to cover a plurality of thin film encapsulating layers, and (5) a fifth step S50 of separating the plurality of unit cells into individual unit cells by cutting the mother substrate and the polarization film.

Figure 5:
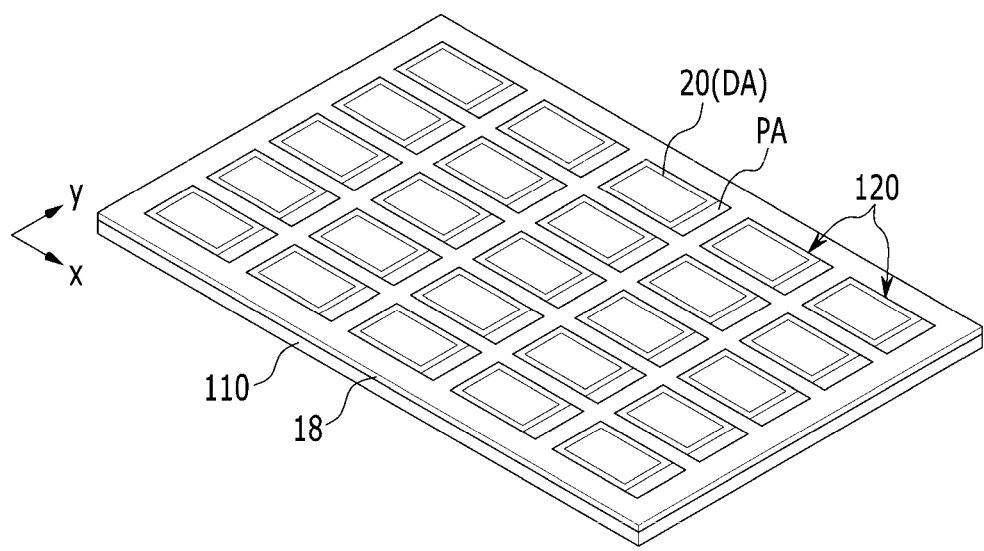
FIGS. 5, 6, and 7 are perspective views illustrating a mother substrate with plural ones of the organic light emitting diodes displays in the second step, the third step, and the fourth step illustrated in FIG. 4, respectively.

FIG. 5 is a perspective view illustrating the organic light emitting diodes display in the second step illustrated in FIG. 4.

Referring to FIGS. 1 and 5, the inorganic layer 18 is blanket-formed (e.g., blanket deposited) on an entire upper surface of a mother substrate 110 (e.g., one formed of a base polymer). The inorganic layer includes at least one of the barrier layer 12 and the buffer layer 13.

The flexible mother substrate 110 of the first step S10 and the second step S20 is supported by a rigid carrier substrate (not illustrated) to maintain a flat state in a process of forming the inorganic layers 18 and the display units 20. The carrier substrate may be a glass substrate, and the flexible mother substrate 110 may be formed by a method of spin coating a polymer material on the glass carrier substrate and curing the polymer material. The carrier substrate is separated from the mother substrate 110 after forming the thin film encapsulating layer 30 or attaching the cracks-suppressing polarization film 40.

The mother substrate 110 has a size sufficient for including a predetermined number of plural unit cells 120, and the plurality of unit cells 120 is positioned in parallel in a first direction (x-axis direction) and a second direction (y-axis direction) crossing the first direction of the mother substrate. Each unit cell 120 includes a respective display area DA and a respective pads area PA. The display units 20 including the plurality of pixel circuits and the plurality of organic light emitting diodes are positioned in the display area DA. The pad electrodes (not illustrated) are connected with the respective pixel circuits and are positioned in the pads area PA.

One or more integrated circuit chips (e.g., scan lines driving chip and/or data lines driving chip) may be mounted in the pads area PA in the second step S20 or may be mounted in the pads area PA after the fifth step S50. In FIG. 5, a case where the display unit 20 and the pads area PA are adjacent in the first direction (x-axis direction) is illustrated as an example.

Figure 6:
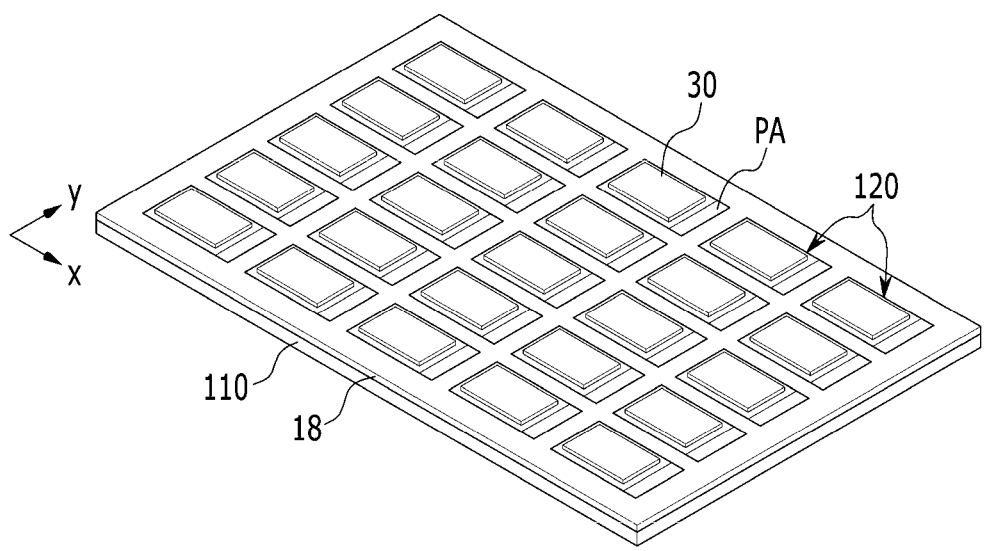

FIG. 6 is a perspective view illustrating the organic light emitting diodes display in the third step illustrated in FIG. 4.

Referring to FIG. 6, here the thin film encapsulating layer 30 has been formed at the upper portion of each of the plurality of display units 120 in the third step S30. The thin film encapsulating layer 30 is formed by a method in which the plurality of organic layers and the plurality of inorganic layers are alternately and repeatedly stacked one by one, and is formed to have a larger area than that of the respective display unit 120 to cover the edges of the display units 120 and to join with a part of the blanket-formed inorganic layer 18 (see FIG. 2) to thereby individually encapsulate each respective display unit 20 (DA).

Figure 7:
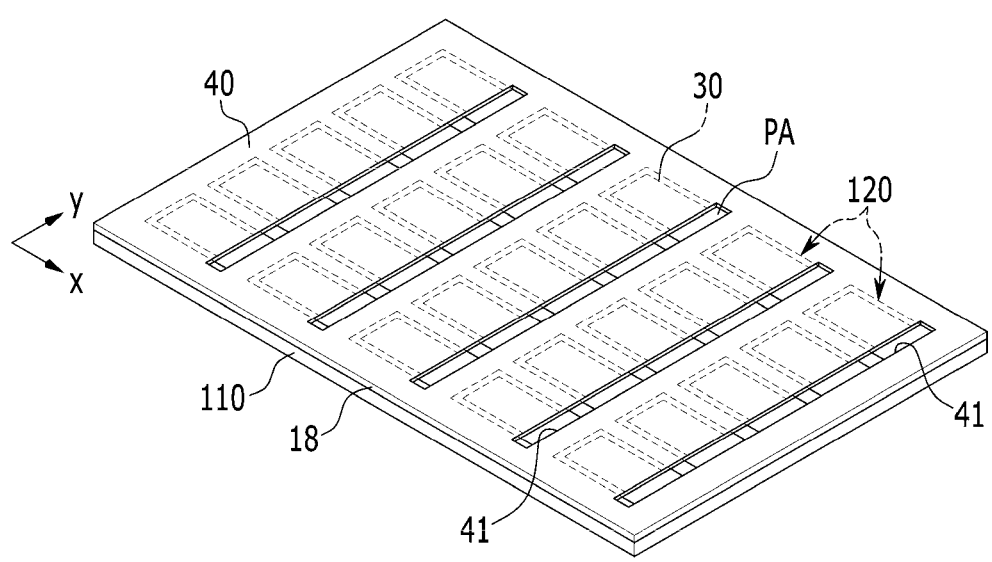

FIG. 7 is a perspective view illustrating the organic light emitting diodes display in the fourth step illustrated in FIG. 4.

Referring to FIG. 7, here the polarization film 40 has been blanket formed on top of the plurality of thin film encapsulating layers 30 in the fourth step S40. The polarization film 40 is one sheet of polarization film material corresponding to the full extent of the mother substrate 110. After or during formation, the one sheet of polarization film 40 is provided with openings 41 as illustrated such that the respective plurality of pads areas PA are exposed and the respective display units 120 can be electrically tested. The one sheet of polarization film 40 simultaneously covers the whole of the thin film encapsulating layers 30 formed on the mother substrate 110, and is in contact with the inorganic layer 18 at the exterior side of the thin film encapsulating layer 30 of each of the respective display units 120.

The plurality of pads areas PA are positioned in parallel in the second direction (y-axis direction) based on FIG. 7. The polarization film 40 is provided with the slit-shaped openings 41 parallel to the second direction, to expose the plurality of pad areas PA positioned in the second direction by using one opening 41. The number of openings 41 may be the same as the number of unit cells 120 positioned on the mother substrate in the first direction (x-axis direction).

Figure 8:
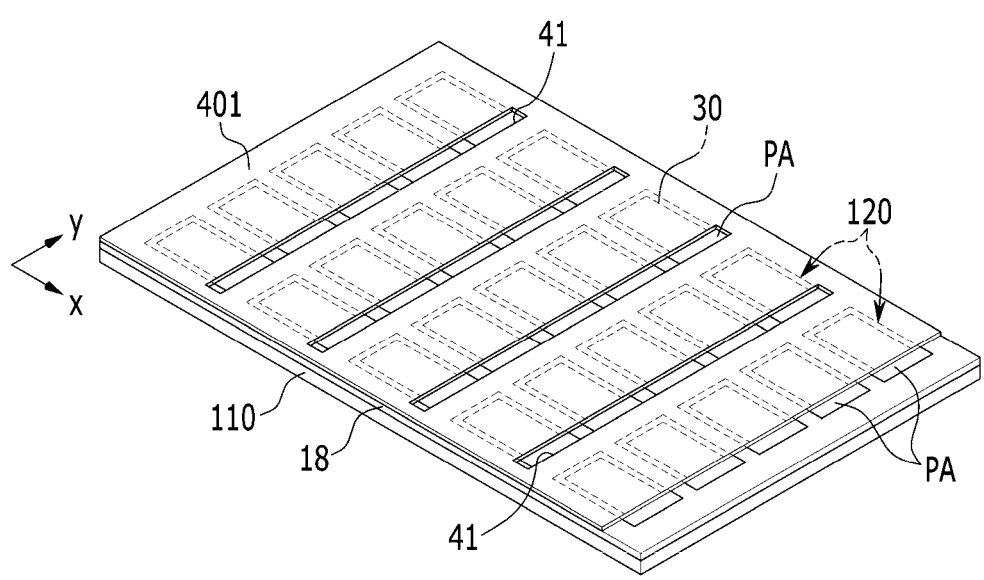
FIG. 8 is a perspective view illustrating a first exemplary variation of a polarization film illustrated in FIG. 7.

FIG. 8 is a perspective view illustrating a first exemplary variation of the patterning of the polarization film as compared to the one illustrated in FIG. 7.

Referring to FIG. 8, in the first exemplary variation, a modified polarization film 401 covers the remaining areas of the mother substrate 110, except for one row of pad areas PA (pad areas positioned at a right-side end (right side in the drawing) of the mother substrate based on FIG. 8) positioned at an outermost side of the mother substrate 110. That is, the one row of pad areas PA are positioned at an exterior side of an edge of one side of the polarization film 401. Thus, less material may be used for forming the modified polarization film 401 as compared to the polarization film 400 of FIG. 7 which covers the entire mother substrate.

The polarization film 401 is provided with openings 41 for the remaining rows of pad areas PA, except for the aforementioned one row of pad areas PA, to expose the pad areas PA. The number of openings 41 of the polarization film 401 in the first exemplary variation is the same as the number subtracted by 1 from the number of unit cells positioned in the first direction (x-axis direction). One sheet of the polarization film 401 of the first exemplary variation also simultaneously covers the whole of the plurality of thin film encapsulating layers 30 formed on the mother substrate 110, and is in contact with the inorganic layer 18 at the exterior side of the thin film encapsulating layer 30.

Figure 9:
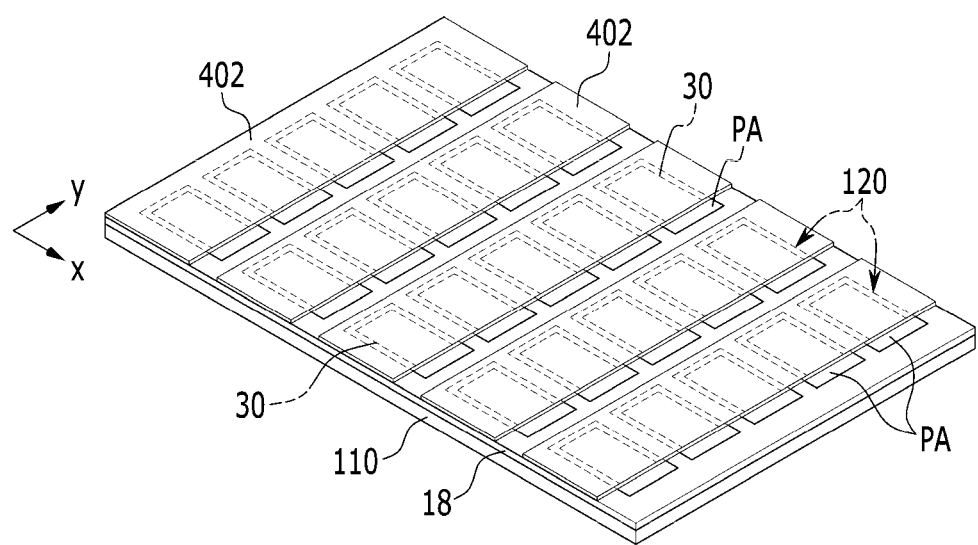
FIG. 9 is a perspective view illustrating a second exemplary variation of the polarization film illustrated in FIG. 7.

FIG. 9 is a perspective view illustrating a second exemplary variation of the polarization film as compared to the one 400 illustrated in FIG. 7.

Referring to FIG. 9, plural polarization films 402 are deposited in rod (rectangular bar) shapes in the second exemplary variation. The plurality of thin film encapsulating layers 30 are positioned in parallel in the second direction (y-axis direction) based on FIG. 9. The rod-shaped polarization films 402 simultaneously each covers one respective row of the thin film encapsulating layers 30 positioned in the second direction. Thus, less material may be used for forming the second modified polarization film 402 as compared to the polarization film 400 of FIG. 7 which covers the entire mother substrate.

The number of rod-shaped polarization films 402 may be the same as the number of unit cells 120 positioned in the first direction (x-axis direction) on the mother substrate 110. One side edge of the polarization film 402 is in contact with the boundary of the pads area PA toward the display area DA, and an opposite side edge thereof is positioned at an exterior side of the edge of the thin film encapsulating layer 30. That is, the polarization film 402 is formed to be larger than the thin film encapsulating layer 30 to be in contact with the inorganic layer 18 on the mother substrate 110.

Figure 10:
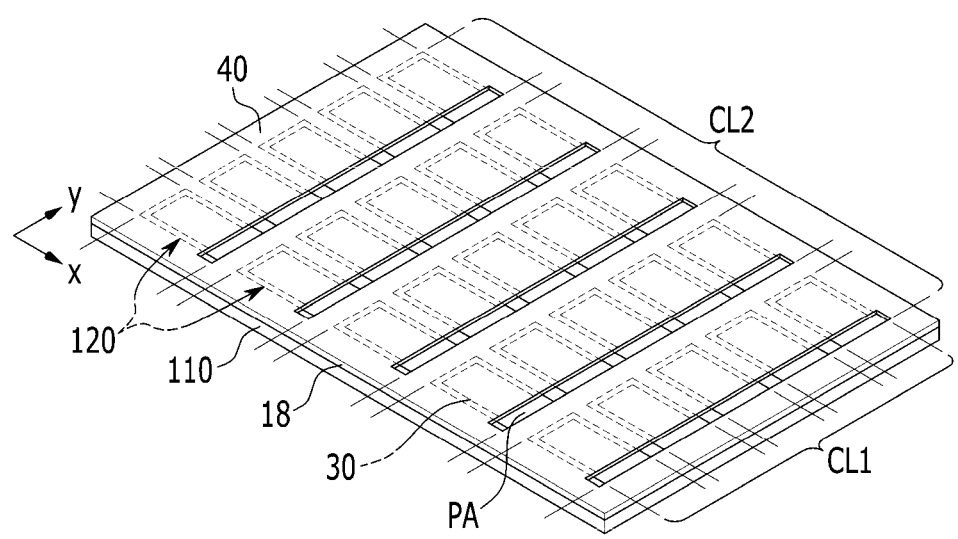
FIG. 10 is a top plan view illustrating the organic light emitting diodes displays in the fifth step illustrated in FIG. 4.

FIG. 10 is a top plan view illustrating the organic light emitting diodes display in the fifth step illustrated in FIG. 4.

Referring to FIG. 10, the mother substrate 110 in the fifth step S50 is cut (diced) along a first cutting line CL1 to be separated by a rod unit in which the plurality of unit cells 120 is connected in one direction. Then, the mother substrate 110 is cut along a second cutting line CL2 to be separated into individual unit cells. The first cutting line CL1 is parallel to any one direction of the first direction (x-axis direction) and the second direction (y-axis direction), and the second cutting line CL2 crosses the first cutting line CL1.

According to the aforementioned method of manufacturing the organic light emitting diodes display 100, after the thin film encapsulating layer 30 is formed, the respective polarization film 40, 401, or 402 is attached instead of a passivation film. In this case, the plurality of thin film encapsulating layers 30 may be simultaneously covered by using one sheet or several sheets of polarization films 40, 401, or 402. The attached polarization film (e.g., 40, 401, or 402) simultaneously suppresses crack formation and reduces perception of artifact lights from internal reflections. Accordingly, it is possible to omit a process of attaching a passivation film and a process of removing the passivation film, and it is possible to simplify a process of attaching the polarization film which has been performed on each of the unit cells 120.

Further, the polarization film 40, 401, or 402 covers and protects the inorganic layer 18 at the exterior side of the thin film encapsulating layer 30. Accordingly, the organic layer 18 at the exterior side of the thin film encapsulating layer 30 is not exposed to the outside during the entire manufacturing and assembling processes after the polarization film 40, 401, or 402 is attached.

Accordingly, it is possible to suppress an occurrence of cracks in the inorganic layer 18 due to external impact, and even though the cracks occur in one spot in the inorganic layer 18 due to the external impact applied from the side surface, the cracks is not propagated to the display units 120 of the mother substrate by the polarization film 40, 401, or 402, thereby not causing a contagiously spread defect.

Whether the organic light emitting diodes display 100 after the fifth step S50 is a non-defective product is determined through an inspection process, and a process of assembling the chip on film and the printed circuit board is performed on the organic light emitting diodes display 100 which is determined as the non-defective product.

According to the present exemplary embodiment, it is possible to suppress an occurrence of spreading cracks of the inorganic layer, and even though the cracks may occur in one spot the inorganic layer, it is possible to block the cracks from being propagated to the other display units of a shared mother substrate. Accordingly, it is possible to prevent a contractible defect according to the propagation of the cracks to the other display units. Further, it is possible to omit a process of attaching a passivation film and removing the passivation film, and to simplify a process of attaching the polarization film.

While this disclosure has been described in connection with what is presently considered to be practical exemplary embodiments, it is to be understood that the present disclosure of invention is not limited to the disclosed embodiments, but, on the contrary, is intended to cover various modifications and equivalent arrangements included within the spirit and scope of the present teachings.

What is claimed is:

1. A method of manufacturing an organic light emitting diodes display, comprising:
    forming an inorganic layer on a mother substrate;
    forming a plurality of spaced apart display units on the inorganic layer so as to define a matrix of unit cells;
    forming spaced apart and respective thin film encapsulating layers at upper portions of respective ones of the display units;
    attaching one or more polarization films to the inorganic layer while at the same time covering all or a corresponding subset of the thin film encapsulating layers; and
    separating the plurality of polarization film covered unit cells into individual unit cells by cutting the mother substrate and the one or more polarization films.

2. The method of claim 1, wherein:
    the mother substrate is formed of a flexible polymer film, and
    each of the plurality of unit cells includes a pads area that is exposed at an exterior side of the display unit so as to be electrically contacted by external circuitry.

3. The method of claim 2, wherein:
    the plurality of unit cells is disposed in a row in two directions crossing each other, and
    each of the plurality of display units and the plurality of pads areas is disposed in a row in one direction between the two directions.

4. The method of claim 3, wherein:
    openings are provided by the one or more polarization films, the openings being substantially same in number as that of rows of pads areas provided on the mother substrates, where the openings are ones through which the respective pluralities of pad areas are exposed.

5. The method of claim 4, wherein:
    the one or more polarization films are provided with slit-shaped openings parallel to the one direction to simultaneously expose the plurality of pads areas positioned in the one direction.

6. The method of claim 5, wherein:
    one row of pads areas among the plurality of pad areas are positioned at an exterior side of one outer side edge of the one or more polarization films.

7. The method of claim 3, wherein:
    for the case of more than one polarization films, the polarization films are formed in rod shapes parallel to the one direction to cover one row of thin film encapsulating layers positioned in parallel to the one direction among the plurality of thin film encapsulating layers.

8. The method of claim 7, wherein:
    respective one side edges of the respective polarization films are each in contact with a boundary of the pads area that is toward the display unit, and an opposite side edge thereof is positioned at an exterior side of the edge of the thin film encapsulating layer.

9. The method of claim 1, wherein:
    the polarization film in the individual unit cell is positioned on the thin film encapsulating layer and on the inorganic layer at an exterior side of the thin film encapsulating layer.

10. The method of claim 1, wherein:
    the corresponding subset comprises a plurality of thin film encapsulating layers.

11. The method of claim 1, wherein:
    the one or more polarization films is attached to be in contact with the inorganic layer.

12. A method of manufacturing an organic light emitting diodes display, comprising:
    forming an inorganic layer on a mother substrate;
    forming a plurality of spaced apart display units on the inorganic layer so as to define a matrix of unit cells;
    forming spaced apart and respective thin film encapsulating layers at upper portions of respective ones of the display units;
    attaching one polarization film to the inorganic layer while at the same time covering all or a corresponding subset of the thin film encapsulating layers; and
    separating the plurality of polarization film covered unit cells into individual unit cells by cutting the mother substrate and the one polarization film.

* * * * *